United States Patent [19]

Flower

[11] 4,280,222

[45] Jul. 21, 1981

[54] RECEIVER AND CORRELATOR SWITCHING METHOD

[75] Inventor: Robert A. Flower, White Plains, N.Y.

[73] Assignee: The Singer Company, Little Falls, N.J.

[21] Appl. No.: 112,028

[22] Filed: Jan. 14, 1980

[51] Int. Cl.[3] .......................... H04K 1/02; H03K 3/84

[52] U.S. Cl. .......................................... 375/38; 375/1; 375/115; 370/107

[58] Field of Search ........................... 455/38, 1, 2, 35; 375/1, 38, 40, 42, 45, 46, 47, 48, 66, 67, 68, 58, 88, 89, 90, 114, 115, 116, 94, 95, 96, 83, 84, 85; 370/18, 19, 20, 53, 107

[56] References Cited

U.S. PATENT DOCUMENTS

| | | | |
|---|---|---|---|
| 3,239,761 | 3/1966 | Goode | 455/38 |
| 3,253,259 | 5/1966 | Jacoby | 375/38 |
| 3,737,776 | 6/1973 | Fletcher | 375/67 |
| 4,037,159 | 7/1977 | Martin | 375/1 |
| 4,177,427 | 12/1979 | Shores | 375/102 |
| 4,185,172 | 1/1980 | Melindo | 375/96 |

*Primary Examiner*—Benedict V. Safourek
*Assistant Examiner*—Stephen Chin
*Attorney, Agent, or Firm*—John C. Altmiller; Thomas W. Kennedy

[57] ABSTRACT

A method and apparatus for receiving and correlating coded digital information with increased anti-jamming capability. The apparatus uses a receiver for each pair of frequencies at which the information is transmitted, a synchronizer for synchronizing the transmitter and receives, a correlator and a code sequence generator. The receiver is alternately operated at one of two frequencies over a predetermined period, and each correlator is provided with a number of sections equal to the maximum number of codes to be transmitted at each of the frequencies.

4 Claims, 2 Drawing Figures

RECEIVER AND CORRELATOR SWITCHING METHOD

BACKGROUND OF THE INVENTION

This invention relates to data transmission in general and more particularly to an improved method for obtaining a more secure data transmission between a transmitter and one or more receivers.

In various transmission systems for transmission of messages, typically in digital form, between military operating units, for example, the ability to achieve secure transmissions becomes a problem.

In many communication system applications there is a need for security from detection, demodulation and interference or jamming. Techniques have been developed to provide for these security needs, and among them are what is referred to as spread spectrum techniques. These techniques are explained in some detail in the publication, "Spread Spectrum Techniques ", Ed. by R. C. Dixon, IEEE Press, 1976.

Two of the techniques disclosed in the article are pertinent to the subject matter of this invention. The first is the concept of encoding the information to be transmitted so that unauthorized reception yields no useful information, this is generally referred to as a direct sequence modulated system. The encoding is usually accomplished by modulating the incoming digital information with a higher speed code sequence which is then used to suppressed-carrier modulate a Radio Frequency carrier. The high speed code sequence determines the Radio Frequency bandwidth since it dominates the modulating function. The signal is then received in a receiver which multiplies the wide-band signal with a locally generated replica thus collapsing the wide-band signal into a bandwidth resulting in a bandwidth having only the information transmitted. The information is then demodulated.

The other technique is the use of different frequencies during certain time intervals, this is usually referred to as the frequency hopping technique. Present frequency hopping systems utilize a code sequence to select the frequency employed at any one particular time.

In both the direct sequence modulated system and the frequency hopping system it is common to transmit messages in serial pulse format with terminals receiving only one message at a time. Typically, the message is preceded by what is called a sync preamble. The sync preamble is a coded message which permits a receiver to detect a fact that a message is coming and to place it in a position to receive that message.

In the frequency hopping system, a code which can consist of up to 32 what are known as "chips" may be transmitted at each frequency. Thus, for example, the transmitter will first transmit at a first frequency f1 a code, c1 which includes 32 chips. Typically this is done by transmitting a carrier burst for a duration of 6.4 micro seconds. The carrier can be phase modulated so as to present the 32 chips each lasting for 200 nano seconds. Each chip can have one of two phase values, i.e., it can be either in phase or out of phase. After transmitting the first code c1 at the first frequency f1, the transmitter then transmits a second code c2 at a different frequency f2. Next, a third code is transmitted either at a different frequency f3 or possibly, again, at the same frequency f1. For the purposes of discussion assume it is at f1. It then transmits a fourth code c4 at another frequency which can be a separate frequency, again, but which for the sake of the present discussion will be assumed to be at f2.

At the receiver end, these four codes which are transmitted must be detected and decoded. Both the transmitter and receiver are automatically programmed to continually change the codes, and the transmitter and receiver are synchronized. Very accurate synchronization systems are known in the art, for example that disclosed in U.S. Pat. No. 4,005,266. The synchronization system described in the aforementioned patent permits one or more local time base systems to be synchronized to a master base system having an oscillator driven clock.

The time synchronization error between the systems is measured at predetermined sampling times and frequency and phase correction signals for the local oscillators and time correction signals for the local clocks are derived from the measured error at each of the sampling times. The oscillator correction signals are applied to the local oscillator and the time correction signals are applied to the local clock at gains which are a function of the magnitude of the error and the number of sampling times between corrections, so that corrections are made which are based upon the rate-of-change of error over the recent history of prior error corrections and not merely upon the instantaneous value of the measured error at each sampling time.

The apparatus for synchronizing master and local time base systems disclosed in that patent provides rapid, accurate slaving of remotely located local clocks and oscillators to a master clock and oscillator through the use of coded signals. Depending on the amount of security desired the conditions at the receiver may be set up such that reception of any one of the codes is sufficient to put the receiving system in a mode which enables it to receive a message. At the other extreme, the condition that all four codes must be received may be a condition precedent to receiving the message.

The typical manner of constructing the receiving means to respond to a transmission of this type in the prior art was to provide two separate receivers, one operating at the frequency f1 and the other operating at the frequency f2. Associated with each receiver would be one or more correlators for decoding or correlating the transmitted code with the preset reference.

With regard to the codes used, it should be noted that the codes are continually changed for purposes of security. Thus, for any given transmission there will be a series of codes such as c1, c2, c3, and c4. The codes for the next transmission might be c5, c6, c7, and c8. Both the transmitter and receiver are automatically programmed to continually change these codes and are synchronized as explained above so that the receiver knows at a given time which codes the transmitter will be sending. The details of exactly how this is done is beyond the scope of the present invention.

As a code is received by the receiver, it is fed in to the correlator. As noted above, it will be a burst at a carrier frequency which is phased modulated. For example, in phase could be considered to be zero and out of phase to be a one. Thus, a code containing 32 bits of phase modulated information will be received. In the correlator, the received code is compared with the predetermined code, which the receiving station knows should be sent at this time. Only when the same code is received is the message considered proper. Thus, the correlator compares the received 32 chip signal with a reference 32 chip signal and, if they are the same, provides a maximum signal output indicating that the code is proper.

Correlators useful for this purpose are well known. Typically such a correlator comprises an acoustic surface wave delay line in which an acoustic wave is set up in a piece of quartz. Spaced along the quartz are 32 detectors representing the 32 chips. The outputs of the detectors are either provided directly or through an invertor to a summing point with a signal from the summing point indicating the correctness of a code. At each of the 32 positions the signal can be fed directly or inverted. This is controlled in accordance with the reference signal which is predetermined and which is to appear at a given time. Thus, a code sequencer or what is referred in the aforementioned Dixon publication as pseudo random noise generator preprograms the correlators to accept only the proper code.

Spread spectrum systems offer many advantages in addition to the inherent message privacy or security advantage. One of these advantages is interference rejection which occurs as a result of the spectrum spreading and subsequent de-spreading necessary for the operation of the receiver. This type of systems offer an improvement in the signal-to-noise ratio of its receiver's Radio Frequency input and its baseband output. A measure of that improvement is the "process gain", which is the ratio of the spread, or transmitted bandwidth, to the rate of the information sent. The amount of interference that a receiver can withstand while operating a tolerable output signal-to-noise ratio is referred to as the antijamming margin, which is determined by the system's process gain.

In accordance with the prior art arrangement, one thus requires a separate receiver for each frequency. In many systems more than two frequencies are required, thus multiplying the number of receivers and the cost and size of the system. It thus becomes evident that there is a need for an improved manner of carrying out such communications while still maintaining good security and antijamming properties.

SUMMARY OF THE INVENTION

The present invention provides such a method and an improved receiver correlator combination for carrying out this method.

In accordance with the present invention, each receiver is arranged to operate at two frequencies and is switched between the two frequencies spending equal time in each. With proper timing, the receiving terminal will always have available to it, assuming the example above with two frequencies and four codes, one code burst at the frequency f1 and one code burst at the frequency f2 irrespective of the phase frequency code switching cycle at the time of arrival of the sink pulses.

This enables one receiver to cover two expected frequencies potentially providing a 3db anti-jamming advantage over a non-switchable single receiver, two section correlator assembly which can operate at either but not both frequencies. When used with a typical sync preamble having substantially more frequencies than two, it can provide a saving in hardware, since n different frequencies can be covered by n/2 receivers without a reduction in the anti-jamming margin.

DETAILED DESCRIPTION OF THE INVENTION

Figure 1:
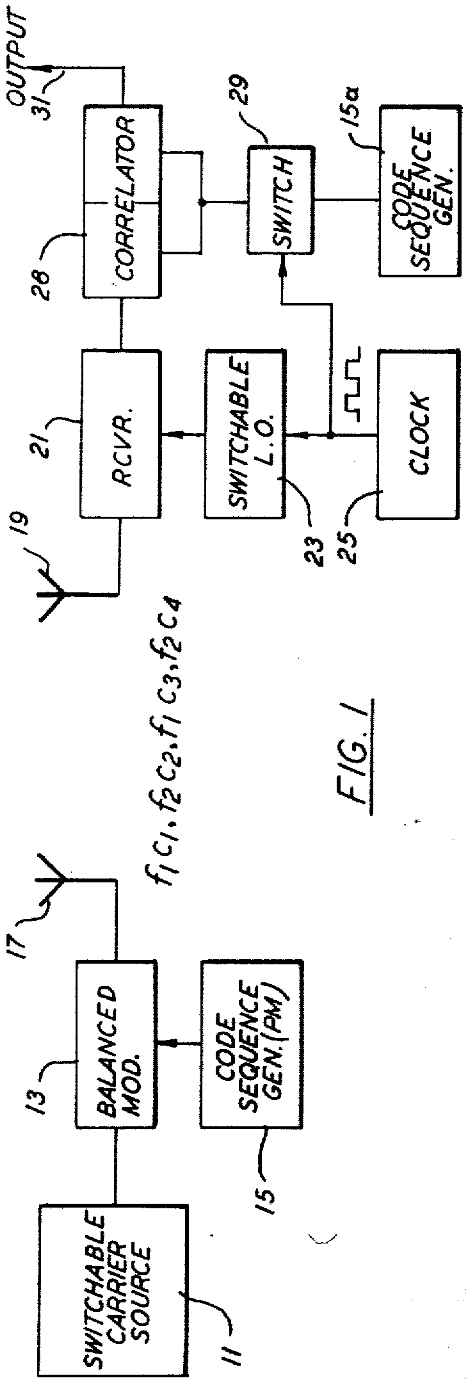
FIG. 1 is a system block diagram of apparatus for carrying out the method of the present invention including the receiver and correlator combination of the present invention.

As illustrated by FIG. 1 a transmitter which includes a switchable carrier source which can switch between the frequencies f1 and f2 provides its output to a balanced modulator 13, which receives an input from a code sequence generator 15. The output of the balanced modulator is fed, with appropriate amplification to an antenna 17. The carrier source first provides a burst, typically for 6.4 micro seconds, at a frequency f1. In the balanced modulator 13 this burst is phased modulated by the code sequence generator 15 in accordance with a predetermined code to be used at the particular time of day. Thus, the burst, so modulated is transmitted by the antenna 17. In sequence, the transmitter then transmits, at a frequency f2 the code c2 then at the frequency f1 the code c3 and then at the frequency f2 the code c4. The transmission of these codes is illustrated on FIG. 2 which is a plot of frequency versus time. At a receiving terminal, a receiver 21 is fed from an antenna 19. The receiver has associated with it a switchable local oscillator 23 which is switched between the frequencies f1 and f2 by a clock 25. The switching at the receiver is illustrated on FIG. 2 by the switching wave form 27. The output of the receiver is fed to a two section correlator 28. The correlator receives as an input the code sequence from code sequence generator 15*a*, which is essentially identical to the code sequence generator 15 and contains the same code sequence. The two code sequence generators are synchronized with each other by means beyond the scope of the present application. The code sequence generator, for a given transmission at a given time provides as outputs the four codes c1, c2, c3, and c4. It can include buffers in which these codes are stored. When operating at the frequency f1, the two correlator sections of the correlator 28 must be fed with the codes c1 and c3 and when operating at the frequency f2 with the codes c2 and c4. Thus, the output of the clock 25 is also provided to a switch 29 which switches the proper codes into the correlator section of correlator 28.

Figure 2:
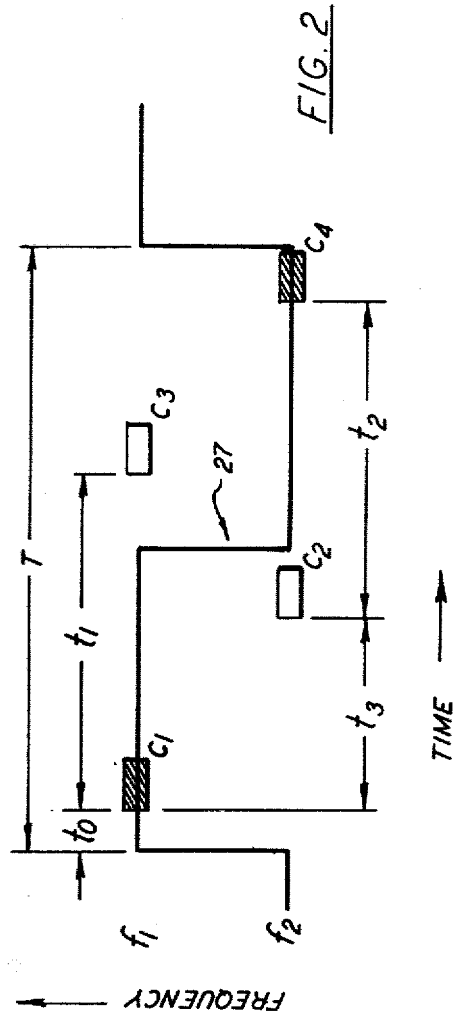
FIG. 2 is a timing diagram showing the switching between frequencies at the receiver of FIG. 1.

In order for the system to work properly, certain timing relations are required. In the diagram of FIG. 2, the codes c1 and c4 are received while the codes c2 and c3 are rejected. Thus, in the illustrated embodiment when the code c1 is being transmitted at the frequency f1 the receiver 21 will be tuned to frequency f1 and that code will be received and provided into the correlator 28. Because of the switch 29 the correlator will be preprogrammed with this code and the correlator should respond and provide a maximum signal at its output 31. When the code c2 is transmitted at the frequency f2 the receiver will be still tuned to frequency f1 and this code will not be received. Similarly, when the code c3 is transmitted at f1 the receiver will be tuned to f2 and this will not be received. However, the code c4 will be received since at its time of transmission the receiver is tuned to the frequency f2. Again, the correlator will be properly programmed and a maximum output on line 31 will result. The output is fed to additional circuits which may be adapted to indicate that a valid message is incoming upon receipt of one of the codes or upon receipt of both depending on the system security desired. Furthermore, additional receivers responsive to additional frequencies may also be provided to add security.

At this point it might be well to note that if the exact time when the pulses were being received were known, one could carry out switching between the frequencies f1 and f2 in accordance with the switching of the transmissions. However, although the systems can be synchronized within approximately a micro second the synchronization is generally not good enough to permit such accurate switching. For example, the propagation time of the signal between the transmitting unit and the receiving unit may be many times the signal burst repetition interval, and the propagation path distance may not be known at the receiving unit. A synchronization time uncertainty at least as great as the maximum propagation time is thus present prior to the time of arrival of any message. For the system of the present invention to work properly, certain time relationships are required. The period of the square wave used in switching the receiver between the frequencies is designated as $\tau$. The time between the pulses c1 and c3, i.e., the two pulses transmitted at the frequency f1 is designated t1 and the time between the pulses c2 and c4 as t2. The time between transmitting the pulse or burst c1 and the burst c2 is designated as t3. The offset time is designated $t_0$. This is the time between switching to f1 and the receipt of the first pulse at the frequency f1, i.e., the pulse c1. This offset time can vary between the limit of zero and $\tau$. It should also be noted that the sequency of pulses c1, c2, c3 and c4 is repeated and thus there will be another pulse c1 occuring to the right of the pulse c3 on FIG. 2.

If the two pulses at the frequency f1 have a time separation ($t_2$) equal to $\tau/2$ or any odd multiple of $\tau/2$, it is evident that the receiver will, except during switching intervals, always be tuned to f1 at the time of arrival of one or other pulse. Thus, since the correlators are set for both c1 and c3 when the receiver is at f1 one of the pulses will be made available for processing. When switching occurs during the pulse time, part of each pulse will be erased, i.e., some of its chips will not be detected. Therefore, rapid switching is desired. In the ideal condition of zero switching time, the worst case is loss of half of each pulse, giving two correctly timed correlation peaks at a reduced level, i.e., the output resulting from each correlation would be reduced but still present. Thus, by proper summing of all the tapped outputs in the correlator, detection is still possible.

What has just been said applies equally to the two pulses at f2. That is to say the time period $t_2$, as well as the time period $t_1$, must be an odd multiple of $\tau$ over 2. The two can, and for the best anti-jamming result should, be different odd multiples. t3 can have any arbitrary value.

In the general case there are two or more (n) frequencies used, the following rules must be observed:

(a) the n different frequencies must be grouped in pairs;

(b) the pulses in each pair of frequencies must be spaced on the basis of a common odd sub multiple;

(c) different pairs can have different sub multiple bases; and (d) the start time for the pulses at any frequency can be arbitrarily selected relative to those of others.

What is claimed is:

1. In a communication system where a transmitter transmits a series of codes at at least two different frequencies with the codes received at a receiving terminal and correlated with predetermined codes, and improved method of transmitting and receiving the data so as to reduce hardware requirements comprising:
   (a) grouping each of the at least two different frequencies in pairs;
   (b) providing only a single receiver for each pair of frequencies;
   (c) providing for each receiver a correlator with a number of sections equal to the maximum number of codes to be transmitted at either of the frequencies to which it is assigned;
   (d) switching the receiver between its two assigned frequencies such that it spends equal time at each frequency utilizing a square wave having a period $\tau$;
   (e) alternately transmitting the pulses at each frequency of a pair, with the spacing between pulses at each frequency being an odd multiple of $\tau/2$.

2. The method according to claim 1 wherein the spacing of the pulses at the one frequency of a pair is a different odd multiple than the spacing of the pulses at the other frequency of the pair.

3. An improved communication system including a receiver correlator arrangement for receiving and correlating a plurality of pulses transmitted at two different frequencies comprising:
   (a) a receiver including a switchable local oscillator for switching said receiver between said two frequencies;
   (b) clock means for controlling said switchable local oscillator;
   (c) a two section correlator receiving an input from said receiver;
   (d) a first code sequence generating means generating and storing each of the codes to be received by said correlator; and
   (e) switching means receiving an input from said clock for providing as reference inputs to said correlator sections each of the codes which are known to be transmitted at the frequency to which the receiver is then switched; and including a transmitter arrangement for transmitting the plurality of pulses at the two different frequencies comprising:
   (a) a balanced modulator having an output for transmission of the pulses to the receiver at the two different frequencies;
   (b) a switchable carrier source for switching between said two frequencies and for providing an input to said balanced modulator; and
   (c) a second code sequence generating means adapted to be synchronized to said first code sequence generating means for providing an input to said balanced modulator.

4. The improved receiver correlator arrangement of claim 3 wherein pulses are transmitted at n frequencies where n is greater than two and further comprising an additional receiver for each pair of frequencies at which the pulses are transmitted beyond two.

* * * * *